United States Patent
Moon et al.

(10) Patent No.: US 9,543,520 B1
(45) Date of Patent: Jan. 10, 2017

(54) METHOD OF MANUFACTURING MASK FOR DEPOSITION

(71) Applicant: Samsung Display Co., Ltd., Yongin-si (KR)

(72) Inventors: Minho Moon, Yongin-si (KR); Youngmin Moon, Yongin-si (KR); Sungsoon Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/096,820

(22) Filed: Apr. 12, 2016

(30) Foreign Application Priority Data

Oct. 5, 2015 (KR) ........................ 10-2015-0139995

(51) Int. Cl.
| H01L 21/44 | (2006.01) |
| H01L 51/00 | (2006.01) |
| H01L 51/56 | (2006.01) |
| H01L 21/027 | (2006.01) |

(52) U.S. Cl.
CPC ....... *H01L 51/0021* (2013.01); *H01L 21/0273* (2013.01); *H01L 51/0017* (2013.01); *H01L 51/56* (2013.01)

(58) Field of Classification Search
CPC .. H01L 21/0273; H01L 51/0021; H01L 51/56; H01L 51/0017
USPC ........................................................ 438/666
See application file for complete search history.

(56) References Cited

U.S. PATENT DOCUMENTS

2010/0294654 A1    11/2010   Park et al.
2016/0145762 A1*   5/2016    Im .......................... C25D 21/12
                                                              438/46

FOREIGN PATENT DOCUMENTS

| JP | 2005-154879 | 6/2005 |
| JP | 2010-155344 | 7/2010 |
| KR | 10-2008-0095517 | 10/2008 |
| KR | 10-2014-0005464 | 1/2014 |
| KR | 10-2014-0106986 | 9/2014 |

* cited by examiner

*Primary Examiner* — David S Blum
(74) *Attorney, Agent, or Firm* — H.C. Park & Associates, PLC (57) ABSTRACT

A manufacturing method of a mask for deposition including forming a second layer on a side of a first layer, coating a photoresist layer on a side of the second layer, forming a plurality of photoresist patterns which penetrate the photoresist layer according to an exposing and developing process, forming a plurality of pattern grooves in the second layer by etching portions of the second layer, which are exposed through the plurality of photoresist patterns, forming an electro-forming mold by removing the photoresist layer from the second layer, disposing an electrode plate to contact the second layer of the electro-forming mold, performing an electro-forming process of growing a metal layer from the electrode plate in spaces in the corresponding pattern grooves of the second layer of the electro-forming mold, to form a deposition mask, and separating the deposition mask from the electrode plate.

11 Claims, 5 Drawing Sheets

METHOD OF MANUFACTURING MASK FOR DEPOSITION

CROSS-REFERENCE TO RELATED APPLICATION

This application claims priority from and the benefit of Korean Patent Application No. 10-2015-0139995, filed on Oct. 5, 2015, which is hereby incorporated by reference for all purposes as if fully set forth herein.

BACKGROUND

Field

Exemplary embodiments relate to a method of manufacturing a mask for deposition.

Discussion of the Background

Generally, an organic light-emitting display apparatus is one kind of many flat display apparatuses in use today. The organic light-emitting display apparatus is an active light-emitting element that is thin and lightweight with low-voltage driving requirements, and produces wide viewing angles, excellent contrast, and fast response times. Accordingly, the organic light-emitting display apparatus is increasingly being recognized as a next-generation display element.

The active light-emitting element may be classified as either an inorganic light-emitting element or an organic light-emitting element according to a material of a light emission layer included therein. Because the organic light-emitting element has better luminance, response time, and color display characteristics than the inorganic light-emitting element, the development of the organic light-emitting element is actively being performed.

The organic light-emitting display apparatus includes an organic film and/or an organic electrode, which are formed by a vacuum evaporation deposition method. However, because the organic light-emitting display apparatus is currently being developed into a high resolution organic light-emitting display apparatus, a width of an open slit of a mask, which is used in the vacuum evaporation deposition method, becomes narrow, thereby decreasing the distribution of a deposition source in the vacuum evaporation deposition method.

In order to manufacture the high resolution organic light-emitting display apparatus, a shadow effect is reduced or removed. Accordingly, the deposition method is performed in a state that a substrate and a mask closely contact each other, and technologies are being developed to improve the close contact between the substrate and the mask.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a manufacturing method of a deposition mask.

Additional aspects will be set forth in the detailed description which follows, and, in part, will be apparent from the disclosure, or may be learned by practice of the inventive concept.

An exemplary embodiment discloses a manufacturing method of a mask for deposition including forming a second layer on a side of a first layer, coating a photoresist layer on a side of the second layer, forming a plurality of photoresist patterns which penetrate the photoresist layer according to an exposing and developing process, forming a plurality of pattern grooves in the second layer by etching portions of the second layer which are exposed through the plurality of photoresist patterns, forming an electro-forming mold by removing the photoresist layer from the second layer, disposing an electrode plate to contact the second layer of the electro-forming mold, performing an electro-forming process of growing a metal layer from the electrode plate in spaces in the corresponding pattern grooves of the second layer of the electro-forming mold, to form a deposition mask, and separating the deposition mask from the electrode plate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Reference will now be made in detail to exemplary embodiments, examples of which are illustrated in the accompanying drawings, wherein like reference numerals refer to like elements throughout.

FIGS. 1 through 9 are sequential diagrams illustrating a manufacturing method of a deposition mask, according to one exemplary embodiment of the present inventive concept.

Figure 1:
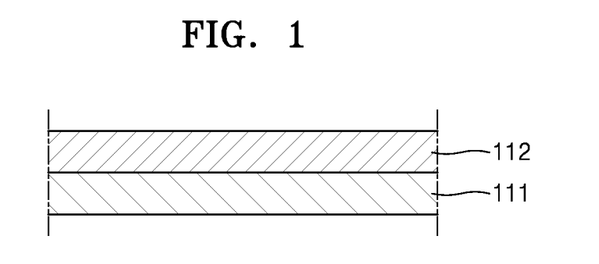
FIG. 1, FIG. 2, FIG. 3, FIG. 4, FIG. 5, FIG. 6, FIG. 7, FIG. 8, and FIG. 9 are sequential diagrams illustrating a manufacturing method of a deposition mask, according to one exemplary embodiment of the present inventive concept.

Referring to FIG. 1, a second layer 112 may be deposited on a surface of a first layer 111. In detail, the second layer 112 is deposited on the first layer 11 according to a chemical vapor deposition process.

Here, the first layer 111 is an electrically non-conductive insulator. For example, the first layer 11 may include at least one of glass, plastic, and polyimide. The second layer 1112 may be a thermally or electrically non-conductive insulator. For example, the second layer 112 may include at least one of silicon nitride ($SiN_x$) and silicon oxide ($SiO_x$).

Figure 2:
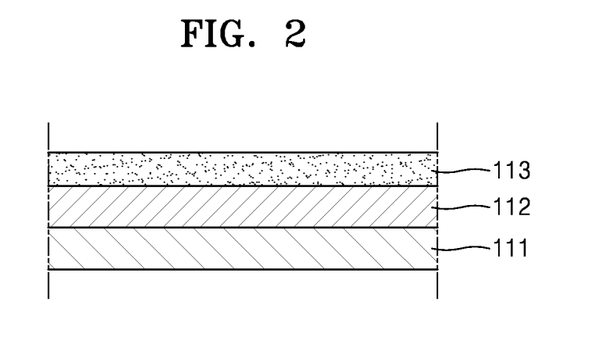
Figure 3:
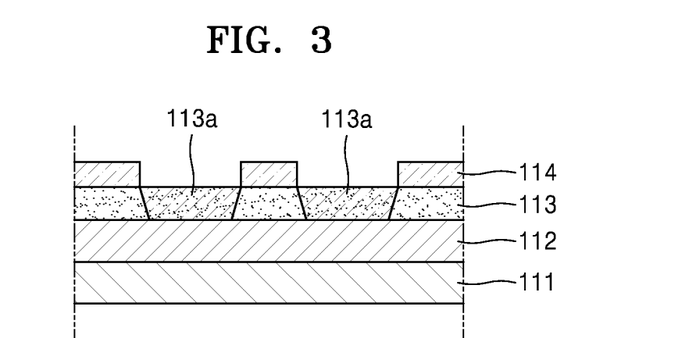

Referring to FIGS. 2 and 3, a photoresist layer 113 may be coated on a surface of the second layer 112. The photoresist layer 113 may be a positive-type photoresist layer or a negative-type photoresist layer and may be coated on the second layer 112. In detail, the positive-type photoresist layer 113 includes a light exposure region which is etched during a developing process after a light exposure process. On the other hand, the negative-type photoresist layer 113 includes a non-light exposure region, which is etched during the developing process.

The photoresist layer 113 may be formed on the second layer 112 by applying a photoresist liquid to a surface of the second layer 112 using various methods of spin coating, spraying, and quenching. The spin coating method of uniformly coating a wide area may be used to form the photoresist layer 113.

Before the photoresist layer 113 is coated on the second layer 112, a polishing process may be performed on the second layer 112 to polish the surface of the second layer 112 on which the photoresist layer 113 is coated. Through the polishing process, the surface of the second layer 112 becomes smooth such that the photoresist layer 113 is uniformly coated on the second layer 112, and thus, stickiness between a deposition mask, which will be manufactured in a following process, and a display apparatus substrate, on which a deposition material is deposited, may be increased.

Next, referring to FIG. 3, after coating the photoresist layer 113 on the second layer 112, a photolithography process is performed on the photoresist layer 113. That is, a photomask 114 having openings to expose portions of the photoresist layer 113 is disposed on the photoresist layer 113. After the photomask 114 is arranged on the photoresist layer 113, the exposure process is performed to expose regions with light other than regions of the photoresist layer 113 where the light is blocked by the photomask 114. In this manner, exposure regions 113a are formed at the portions of the photoresist layer 113 which are exposed to the light.

Figure 4:
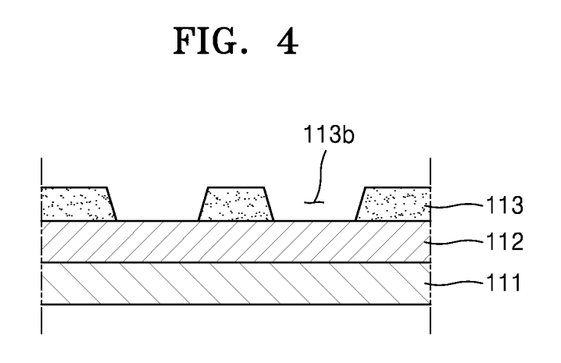

Referring to FIG. 4, according to the developing process, a photoresist pattern 113b is formed by removing the exposure regions 113a, which are formed in the photoresist layer 113 by using the exposure process. The photoresist pattern 113b is formed to penetrate the photoresist layer 113 and exposes portions of the second layer 112 to the outside.

In detail, as illustrated in FIG. 4, the photoresist pattern 113b may have a cross-section which tapers in a thickness direction of the photoresist pattern 113b. That is, the cross-section of the photoresist pattern 13b widens in a direction from a bottom of the photoresist pattern 113b, which meets a surface of the second layer 112, to a top of the photoresist pattern 113b, which is opposite to the bottom of the photoresist pattern 113b.

As described above, because the exposure regions 113a of the photoresist layer 113 are exposed to the outside and etched by light, the photoresist layer 113 is formed from the positive-type photoresist material. However, the present inventive concept is not limited thereto. As described above, the photoresist layer 113 may be formed from the negative-type photoresist material. Thereafter, the photoresist pattern 113b may be formed in the photoresist layer 113 according to the developing process, as illustrated in FIG. 4.

Figure 5:
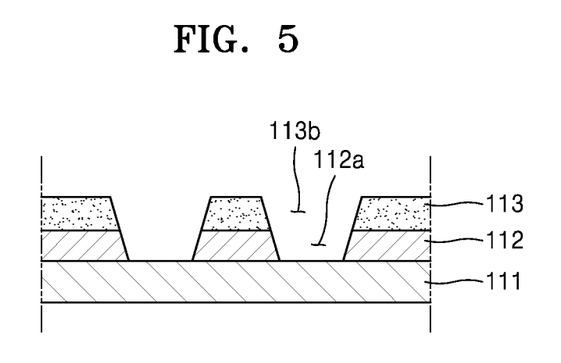
Figure 6:
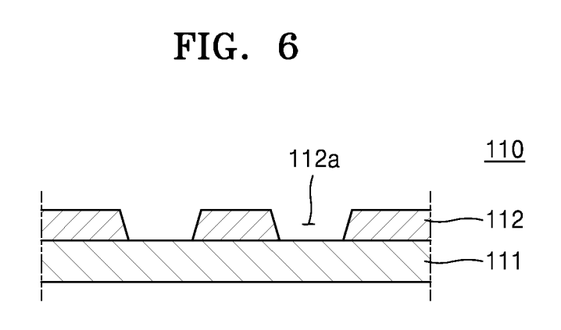

Referring to FIGS. 5 and 6, the region of the second layer 112, which is exposed by the photoresist pattern 113a, is removed by a dry etching process. The region of the etched second layer 112 may include a plurality of pattern grooves 112a.

In detail, the pattern grooves 112a may include a cross-section that tapers in a thickness direction of the second layer 112. That is, the cross-section of the pattern grooves 112a narrows from one surface of the second layer 112, which contacts the photoresist layer 113, to the other surface of the second layer 112, which contacts the first layer 111. After the pattern grooves 112a are formed in the second layer 112, the photoresist layer 113 may be removed from the first layer 111 and the second layer 112 according to a washing process.

After the photoresist layer 113 is removed, an electro-forming mold 110, which is used to manufacture the deposition mask, is formed by stacking the second layer 112 having the pattern grooves 112a on the first layer 111.

Next, a method of manufacturing the deposition mask by using the electro-forming mold 110, which is prepared by the processes of FIGS. 1 through 6, will be explained with reference to FIGS. 7 through 9.

Figure 7:
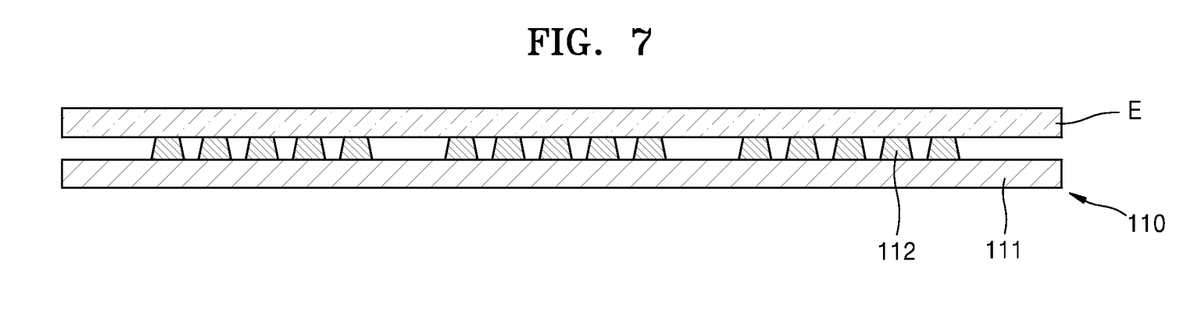
Figure 8:
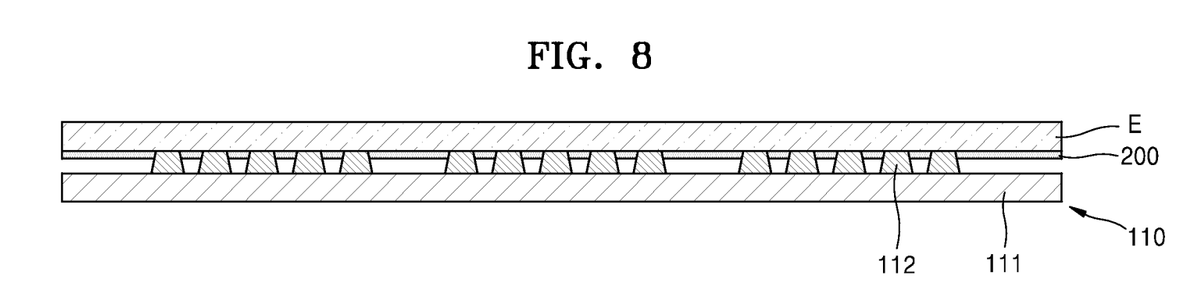
Figure 9:
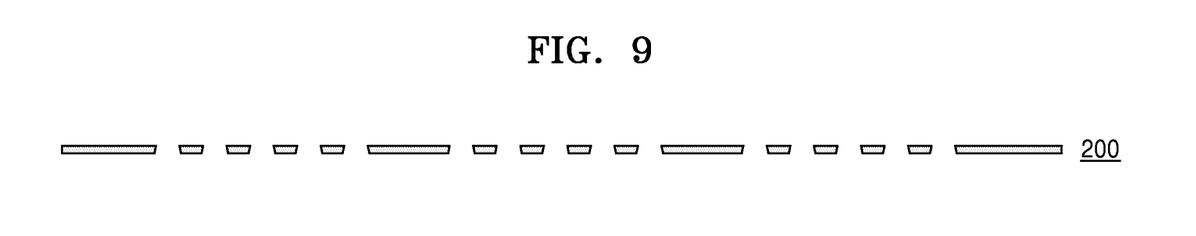

Referring to FIGS. 7 through 9, an electrode plate E may be disposed on the second layer 112 of the electro-forming mold 110. Empty spaces may be formed in a plurality of pattern grooves, which correspond to the pattern grooves 112a of FIG. 6, between the first layer 111 and the electrode plate E, which contacts the second layer 112. In this state, an electro-forming process is performed such that a metal layer grows from the electrode plate E in the empty spaces respectively corresponding to the pattern grooves 112a of the electro-forming mold 110. When the metal layer grows to a predetermined thickness, the electro-forming process is terminated, the electrode plate E is pulled out from a plating bath container, and the metal layer is separated from the electrode plate E, so that a mask 200 for deposition is manufactured.

The electro-forming mold 110 prepared by the processes of FIGS. 1 through 6 may be usable semi-permanently. The above-described electro-forming process may be repeated by using the electro-forming mold 110 so that a plurality of the deposition masks 200 are manufactured. That is, a plurality of deposition masks 200 may be formed by repeating a process of growing a metal layer from the electrode plate E in the spaces of the respective pattern grooves 112a of the electro-forming mold according to electro-plating and a process of separating the deposition masks 200 from the electrode plate E.

The plurality of deposition masks 200 may be manufactured by repeating a single photolithographic process. By using the manufacturing method of the deposition mask, according to the exemplary embodiment of the present inventive concept, the deposition mask 200 may be manufactured without using an additional separate photolithographic process. Because the manufacturing method of the deposition mask 200 is simplified as described above, material costs of the photoresist material and a latent image developer, which are used in the photolithographic process, may be reduced, and also the productivity of the deposition masks 200 increases by shortening a process time of the manufacturing method.

Figure 10:
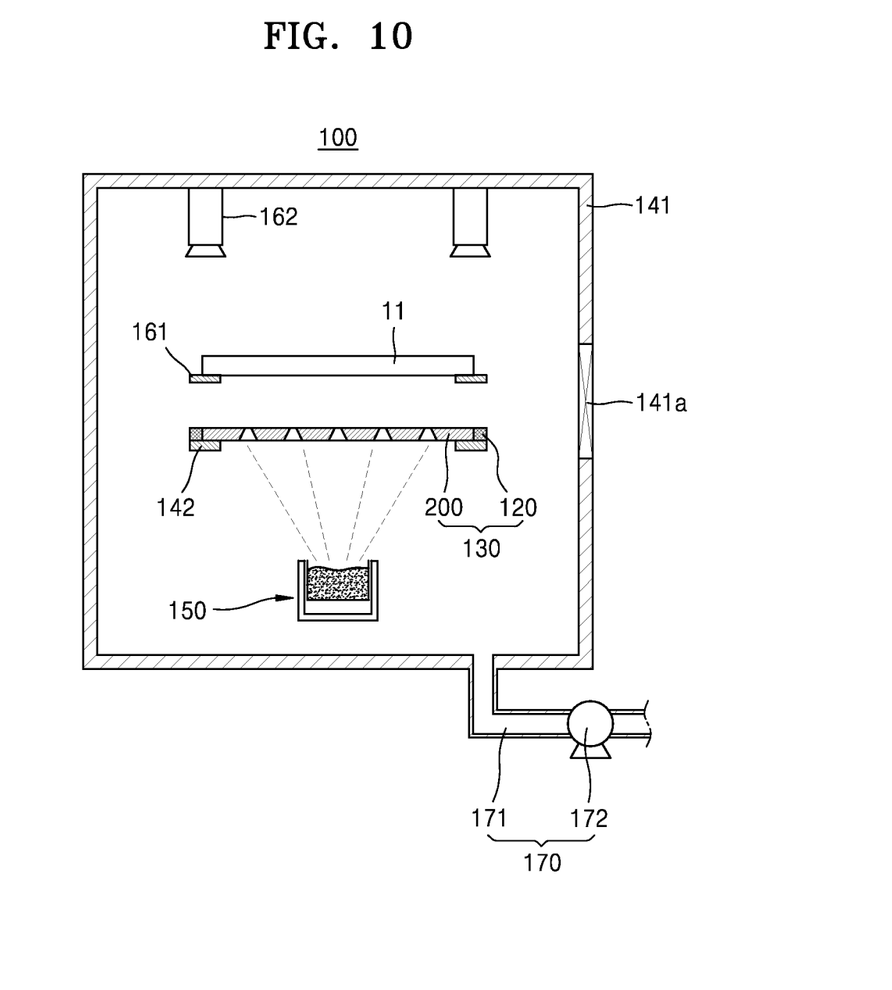
FIG. 10 is a conceptual diagram illustrating a display apparatus manufacturing apparatus including the deposition mask of FIG. 9.
Figure 11:
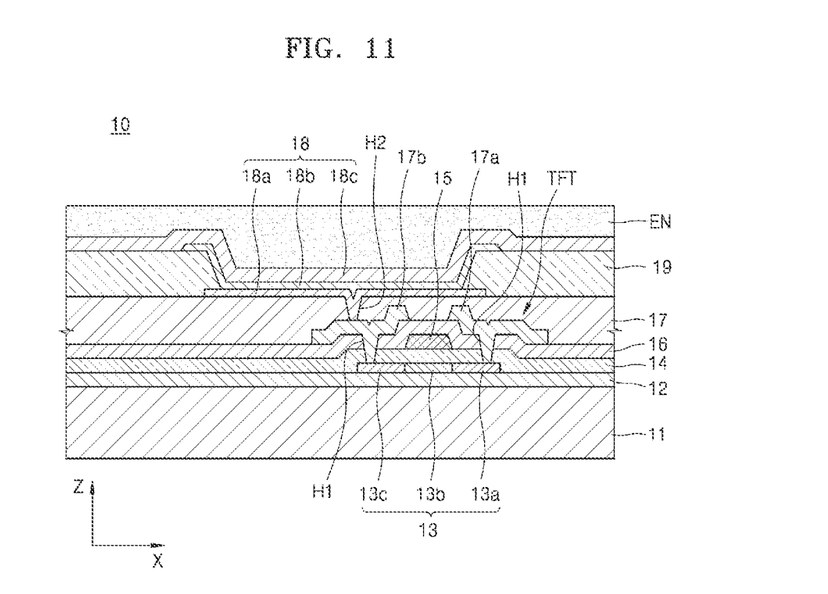
FIG. 11 is a cross-sectional view illustrating a portion of a display apparatus manufactured by the display apparatus manufacturing apparatus of FIG. 10.

FIG. 10 is a conceptual diagram illustrating a display apparatus manufacturing apparatus 100 including the deposition mask 200 of FIG. 9, and FIG. 11 is a cross-sectional view illustrating a portion of a display apparatus 10 manufactured by the display apparatus manufacturing apparatus 100 of FIG. 10.

Referring to FIGS. 10 and 11, the display apparatus manufacturing apparatus 100 may include a chamber 141, a mask frame assembly 130, a seating unit 142, a deposition source 150, a substrate support unit 161, and a vision unit 162. Here, the mask frame assembly 130 may include a frame 120 to fix the deposition mask 200 to the seating unit 142. The deposition mask 200 may be manufactured by the manufacturing method of the deposition mask 200 illustrated in FIGS. 1 through 9.

The chamber 141 may include an interior space and an opening portion for exposing the interior space to the outside. Here, the opening portion of the chamber 141 may be connected to a gate valve 141a, which may open or close the opening portion of the chamber 141.

The mask frame assembly 130 may be seated on the seating unit 142. Here, the seating unit 142 may rotate or linearly move the mask frame assembly 130.

The display apparatus manufacturing apparatus 100 may deposit a deposition material on a first substrate 11 while the first substrate 11 is supported by the substrate support unit 161. In another exemplary embodiment, the deposition material may be deposited on the first substrate 11 while the first substrate 11 and the deposition source 150 relatively move with respect to each other. For convenience, a case in which the deposition material is deposited on the first substrate 11 while the first substrate 11 is supported by the substrate support unit 161 will be explained in detail hereinafter.

A pressure controller 170 may be connected to the chamber 141. Here, the pressure controller 170 may include a connection pipe 171 which is connected to the chamber 141 and a pump 172 which is installed on the connection pipe 171.

The display apparatus manufacturing apparatus 100 may deposit an organic layer, an inorganic layer, or a metal layer on a display apparatus substrate, such as the first substrate 11. For convenience, a case in which the display apparatus manufacturing apparatus 100 deposits an organic layer on the first substrate 11 will be explained in detail hereinafter.

In an operation of the display apparatus manufacturing apparatus 100, the first substrate 11 and the mask frame assembly 130 are charged into the inside of the chamber 141 from the outside, and are seated on the substrate support unit 161 and the seating unit 142, respectively.

Thereafter, locations of the mask frame assembly 130 and the first substrate 11 are measured by the vision unit 162, and then the locations of the mask frame assembly 130 and the first substrate 11 may be rearranged by controlling the seating unit 142. Here, the vision unit 162 may include a camera to photograph the mask frame assembly 130 and the first substrate 11.

After the locations of the mask frame assembly 130 and the first substrate 11 are arranged, the deposition material may be vaporized or sublimed by operating the deposition source 150. Here, the deposition material may be deposited on the first substrate 11 through slots of the deposition mask 200. After the deposition process on the first substrate 11 is completed, the first substrate 11 is discharged from the chamber 141 and the following process is performed on the discharged first substrate 11.

Referring to FIG. 11, the display apparatus manufacturing apparatus 100 may manufacture a display apparatus 10 by forming an intermediate layer 18b, forming an opposite electrode 18c on the intermediate layer 18b, and then forming an encapsulation layer EN or a second substrate (not illustrated) on the opposite electrode 18c.

In detail, the display apparatus 10 may include a first substrate 11 and a light-emitting unit (not illustrated). The display apparatus 10 may also include the encapsulation layer EN or a second substrate which is disposed on an upper side of the light-emitting unit. Here, because the second substrate may be similar to, or the same as, a substrate which is used in a general display apparatus, detail descriptions thereof are omitted. For convenience, the display apparatus 10 including the encapsulation unit EN will be explained in detail hereinafter.

The light-emitting unit may include a thin film transistor TFT, a passivation film 17 disposed to cover the thin film transistor TFT, and an organic light-emitting device 18 formed on the passivation film 17.

The first substrate 11 may include glass. However, the present inventive concept is not limited thereto. The first substrate 11 may include plastic or a metal, such as stainless steel (SUS) or titanium (Ti). The first substrate 11 may include polyimide (PI). For convenience, a case in which the first substrate 11 includes glass will be explained hereinafter.

A buffer layer 12 is formed on an upper side of the first substrate 11 and includes an organic compound or an inorganic compound. The buffer layer 12 may include silicon oxide ($SiO_x$, ($x \geq 1$)) or silicon nitride ($SiN_x$, ($x \geq 1$)).

After an active layer 13 having a predetermined pattern is formed on the buffer layer 12, the active layer 13 is covered by a gate insulation layer 14. The active layer 13 includes a source area 13a, a drain area 13c, and a channel layer 13b formed between the source area 13a and the drain area 13c.

The active layer 13 may include various materials. For example, the active layer 13 may include an inorganic semiconductor material, such as amorphous silicon or crystalline silicon. In another exemplary embodiment, the active layer 13 may include an oxide semiconductor. In another exemplary embodiment, the active layer 13 may include an organic semiconductor material. For convenience, a case in which the active layer 13 includes amorphous silicon will be explained in detail hereinafter.

After an amorphous silicon film is formed on the buffer 12, the amorphous silicon film is crystallized into a crystalline silicon film, and then the crystalline silicon film is patterned to form the active layer 13. In the active layer 13, the source area 13a and the drain area 13c may be doped with impurities according to a type of the thin film transistor TFT, such as a driving thin film transistor TFT (not illustrated) or a switching thin film transistor TFT (not illustrated).

A gate electrode 15 is formed on the gate insulation layer 14 and corresponds to the active layer 13, and an interlayer insulation layer 16 is formed on the gate insulation layer 14 and covers the gate electrode 15 and the gate insulation layer 14.

After contact holes H1 are formed in the interlayer insulation layer 16 and the gate insulation layer 14, a source electrode 17a and a drain electrode 17b are formed on the interlayer insulation layer 16, and contact the source area 13a and the drain area 13c through the corresponding contact holes H1, respectively.

The passivation film 17 is formed on an upper side of the thin film transistor TFT, and a pixel electrode 18a of the organic light-emitting device 18 is formed on an upper surface of the passivation film 17. The pixel electrode 18a contacts the drain electrode 17b of the thin film transistor TFT through a via hole H2, which is formed in the passivation film 17.

The passivation film 17 may include an inorganic and/or organic compound, a single layer, or a multilayer. The passivation film 17 may be formed as a planarization film to flatten an upper surface of a lower layer which is disposed below the passivation film 17 regardless of a curvature of the upper surface of the lower layer. However, it is possible that the passivation film 17 may have a curvature similar to, or the same as, the curvature of the upper surface of the lower layer. The passivation film 17 may include a transparent insulation material to achieve a micro-cavity effect.

After the pixel electrode 18a is formed on the passivation film 17, a pixel definition film 19 is formed to cover the pixel electrode 18a and the passivation film 17, includes an inorganic compound and/or an organic compound, and includes an opening to expose the pixel electrode 18a to the outside.

The intermediate layer 18b and the opposite electrode 18c are formed on the pixel electrode 18a.

The pixel electrode 18a functions as an anode of the organic light-emitting device 18, and the opposite electrode 18c functions as a cathode of the organic light-emitting device 18. It is possible that the pixel electrode 18a functions as the cathode, and the opposite electrode 18c functions as the anode.

The pixel electrode 18a and the opposite electrode 18c are insulated from each other by the intermediate layer 18b. The organic light-emitting device 18 emits light by applying voltages of different polarities to the intermediate layer 18b.

The intermediate layer 18b may include an organic emission layer. In another exemplary embodiment, the intermediate layer 18b may include an organic emission layer and may further include at least one of a hole injection layer, a hole transport layer, an electron transport layer, and an electron injection layer, as a common layer (not illustrated).

A unit pixel may include a plurality of sub-pixels. The plurality of sub-pixels may emit light of various colors. For example, the plurality of sub-pixels may include sub-pixels to respectively emit red light, green light, and blue light, or may include sub-pixels to respectively emit red light, green light, blue light, and white light.

The thin film encapsulation layer EN may include a plurality of inorganic layers or may include an inorganic layer and an organic layer.

The organic layer of the thin film encapsulation layer EN may include a polymer. The organic layer of the thin film encapsulation layer EN may include a single film of one of polyethylene terephthalate, polyimide, polycarbonate, epoxy, polyethylene, and polyacrylate, or a multilayer thereof. The organic layer of the thin film encapsulation layer EN may include polyacrylate. In detail, the organic layer of the thin film encapsulation layer EN may include a polymerized monomer compound, including a diacrylate-based monomer and a triacrylate-based monomer. The monomer compound may further include a monoacrylate-based monomer. The monomer compound may include a general photoinitiator such as 2,4,6-Trimethylbenzoyl phosphine oxide.

The inorganic layer of the thin film encapsulation EN may include a single layer of metal oxide or metal nitride, or may include a multilayer thereof. In detail, the inorganic layer of the thin film encapsulation layer EN may include one of silicon nitride ($SiN_x$), aluminum oxide ($Al_2O_3$), silicon oxide ($SiO_2$), and titanium oxide ($TiO_2$).

An outmost layer of the thin film encapsulation layer EN, which is exposed to the outside, may include the inorganic layer to prevent permeation of moisture into the organic light-emitting device 18.

The thin film encapsulation layer EN may include a sandwich structure in which at least one organic layer is disposed between at least two inorganic layers. In another exemplary embodiment, the thin film encapsulation layer EN may include a sandwich structure in which at least one inorganic layer is disposed between at least two organic layers. In another exemplary embodiment, the thin film encapsulation layer EN may include the sandwich structure in which at least one organic layer is disposed between at least two inorganic layers and the sandwich structure in which at least one inorganic layer is disposed between at least two organic layers.

The thin film encapsulation layer EN may include a first inorganic layer, a first organic layer, and a second inorganic layer, which are disposed above the organic light-emitting device (OLED) 18 in that order.

In another exemplary embodiment, the thin film encapsulation layer EN may a first inorganic layer, a first organic layer, a second inorganic layer, a second organic layer, and a third inorganic layer, which are disposed above the organic light-emitting device (OLED) 18 in that order.

In another exemplary embodiment, the thin film encapsulation layer EN may a first inorganic layer, a first organic layer, a second inorganic layer, a second organic layer, a third inorganic layer, a third organic layer, and a fourth inorganic layer, which are disposed above the organic light-emitting device (OLED) 18 in that order.

Metal fluoride including lithium fluoride (LiF) may be disposed between the organic light-emitting device (OLED) 18 and the first inorganic layer of the thin film encapsulation layer EN. The metal fluoride may prevent damage of the organic light-emitting device (OLED) 18 when the first inorganic layer of the thin film encapsulation layer EN is formed on the organic light-emitting device (OLED) 18 according to a sputtering process.

The first organic layer may have an area smaller than an area of the second inorganic layer, and an area of the second organic layer may be smaller than an area of the third inorganic layer.

Accordingly, a precise pattern may be formed according to the display apparatus manufacturing apparatus 100, and the display apparatus 10 may realize a high resolution image.

While one or more exemplary embodiments have been described with reference to the figures, it will be understood by those of ordinary skill in the art that various changes in form and details may be made therein without departing from the spirit and scope as defined by the following claims.

What is claimed is:

1. A manufacturing method of a mask for deposition, the manufacturing method comprising:
   forming a second layer on a side of a first layer;
   coating a photoresist layer on a side of the second layer, and forming a plurality of photoresist patterns, which penetrate the photoresist layer according to an exposing and developing process;
   forming a plurality of pattern grooves in the second layer by etching portions of the second layer which are exposed through the plurality of photoresist patterns;
   forming an electro-forming mold by removing the photoresist layer from the second layer;
   disposing an electrode plate to contact the second layer of the electro-forming mold;
   performing an electro-forming process of growing a metal layer from the electrode plate in spaces in the corresponding pattern grooves of the second layer of the electro-forming mold, to form a deposition mask; and
   separating the deposition mask from the electrode plate.

2. The manufacturing method of claim 1, wherein the first layer comprises a non-conductive material.

3. The manufacturing method of claim 2, wherein the first layer comprises one of glass, plastic, and polyimide.

4. The manufacturing method of claim 1, wherein the second layer is formed by a chemical vapor deposition process.

5. The manufacturing method of claim 1, wherein the second layer comprises at least one of silicon nitride ($SiN_x$) and silicon oxide ($SiO_x$), where x is a positive integer.

6. The manufacturing method of claim 1, wherein the forming the plurality of pattern grooves comprises dry-etching the portions of the second layer which are exposed through the plurality of photoresist patterns.

7. The manufacturing method of claim 1, wherein the forming the plurality of photoresist patterns comprises forming cross-sections of the plurality of photoresist patterns that taper in a thickness direction thereof.

8. The manufacturing method of claim 7, wherein the cross-sections of the plurality of photoresist patterns widen from one surface of the photoresist layer, which contacts the side of the second layer, to the other surface of the photoresist layer, which opposes the one surface of the photoresist layer.

9. The manufacturing method of claim 1, wherein the forming the plurality of pattern grooves comprises forming cross-sections of the plurality of pattern grooves that taper in a thickness direction thereof.

10. The manufacturing method of claim 9, wherein the cross-sections of the plurality of pattern grooves narrow from one surface of the second layer, which contacts the photoresist layer, to the other surface of the second layer, which opposes the one surface of the second layer.

11. The manufacturing method of claim 1, wherein the deposition mask is formed by repeating a process of performing the electro-forming process of growing the metal layer from the electrode plate in the spaces in the corresponding pattern grooves of the second layer of the electro-forming mold, and a process of separating the deposition mask from the electrode plate.

* * * * *